United States Patent
Iizuka et al.

(10) Patent No.: US 10,437,142 B2
(45) Date of Patent: Oct. 8, 2019

(54) SUPPORT FRAME FOR PELLICLE

(71) Applicant: NIPPON LIGHT METAL COMPANY, LTD., Tokyo (JP)

(72) Inventors: Akira Iizuka, Shizuoka (JP); Koichi Nakano, Shizuoka (JP); Hayato Kiyomi, Shizuoka (JP); Kazuhiro Oda, Shizuoka (JP); Tomohiro Isobe, Shizuoka (JP)

(73) Assignee: NIPPON LIGHT METAL COMPANY, LTD., Tokyo (JP)

( * ) Notice: Subject to any disclaimer, the term of this patent is extended or adjusted under 35 U.S.C. 154(b) by 78 days.

(21) Appl. No.: 15/572,616

(22) PCT Filed: Mar. 2, 2016

(86) PCT No.: PCT/JP2016/056376
§ 371 (c)(1),
(2) Date: Nov. 8, 2017

(87) PCT Pub. No.: WO2016/181689
PCT Pub. Date: Nov. 17, 2016

(65) Prior Publication Data
US 2018/0149965 A1    May 31, 2018

(30) Foreign Application Priority Data
May 8, 2015   (JP) ................. 2015-095445

(51) Int. Cl.
*G03F 1/64* (2012.01)
*C22C 1/00* (2006.01)
*C22C 21/02* (2006.01)
*C22C 21/04* (2006.01)

(52) U.S. Cl.
CPC ............... *G03F 1/64* (2013.01); *C22C 1/00* (2013.01); *C22C 21/02* (2013.01); *C22C 21/04* (2013.01)

(58) Field of Classification Search
CPC .......................................................... G03F 1/64
USPC ................................................................ 430/5
See application file for complete search history.

(56) References Cited

U.S. PATENT DOCUMENTS

| | | | |
|---|---|---|---|
| 7,605,908 B2 * | 10/2009 | Ito ................... | B82Y 10/00 |
| | | | 355/75 |
| 7,901,841 B2 * | 3/2011 | Shirasaki .......... | G03F 1/64 |
| | | | 430/5 |

FOREIGN PATENT DOCUMENTS

| | | |
|---|---|---|
| JP | 2008-065258 A | 3/2008 |
| JP | 2008-112142 A | 5/2008 |
| JP | 2009-025559 A | 2/2009 |
| JP | 2011-075662 A | 4/2011 |
| JP | 5117578 B2 | 1/2013 |
| WO | 2013/141325 A1 | 9/2013 |

OTHER PUBLICATIONS

International Search Report for PCT/JP2016/056376 dated May 24, 2016.

* cited by examiner

*Primary Examiner* — Christopher G Young
(74) *Attorney, Agent, or Firm* — Merchant & Gould P.C.

(57) ABSTRACT

A support frame for a pellicle includes a frame body made of an aluminum alloy. The frame body has: a top surface onto which a pellicle film is bonded; and an underside surface onto which a transparent substrate is bonded. A material of which the frame body is made has a Young's modulus larger than that of which the transparent substrate is made. The structure described above makes it possible to reduce deformation of the transparent substrate.

14 Claims, 2 Drawing Sheets

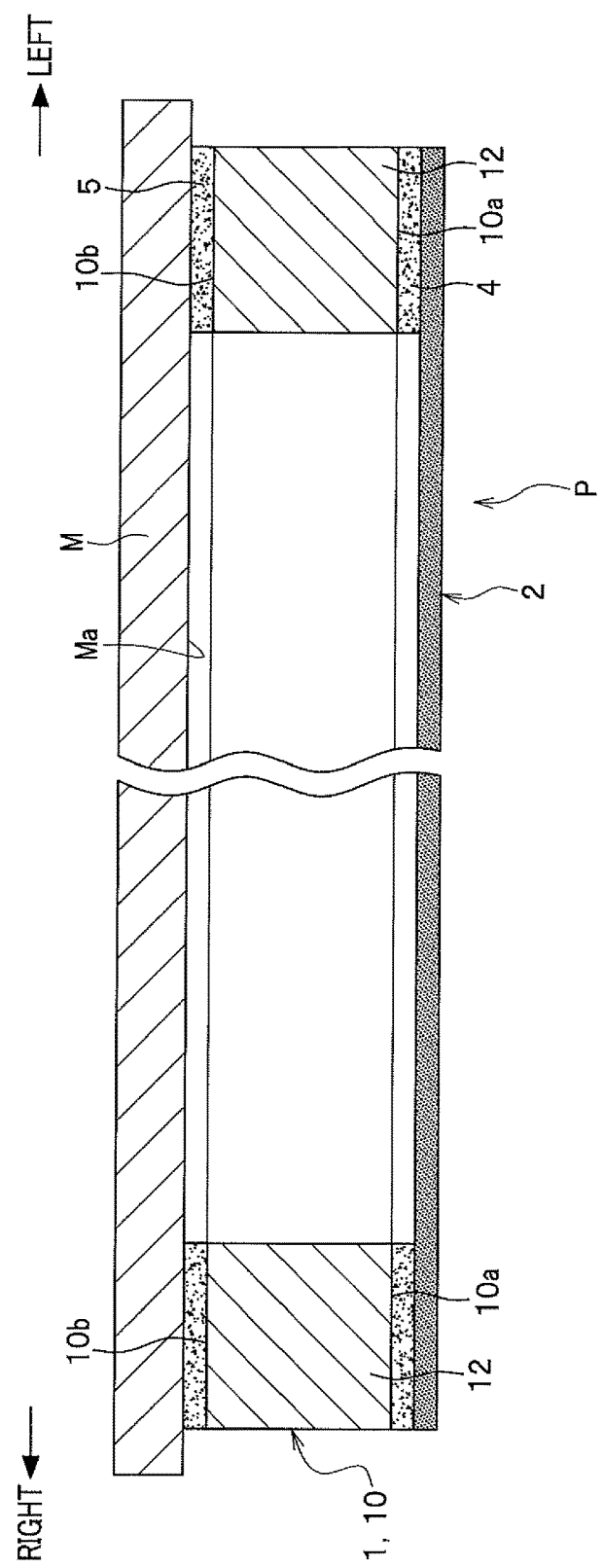

SUPPORT FRAME FOR PELLICLE

CROSS-REFERENCE TO RELATED APPLICATION

This application is a U.S. National Stage Application under 35 U.S.C. § 371 of International Patent Application No. PCT/JP2016/056376 filed Mar. 2, 2016, which claims the benefit of priority to Japanese Patent Application No. 2015-095445, filed May 8, 2015, the disclosures of all of which are hereby incorporated by reference in their entireties.

TECHNICAL FIELD

The present invention relates to a support frame for a pellicle.

BACKGROUND

A process of manufacturing a liquid crystal panel includes a step of photolithography in which a circuit pattern drawn on a transparent substrate called a photomask or a reticle is transferred onto resist applied to a glass substrate.

RELATED ART DOCUMENT

Patent Document

Patent Document 1: Japanese Patent No. 5,117,578

SUMMARY OF THE INVENTION

Problem to be Solved by the Invention

As a larger liquid crystal panel is manufactured, a transparent substrate used also becomes larger. Such a transparent substrate may undergo deflection under its own weight. If deflection is generated in the transparent substrate, there is a problem that, when a circuit pattern on the transparent substrate is transferred onto resist on a glass substrate, the circuit pattern is formed off from a correct position.

The present invention has been made in an attempt to solve the problem described above and to provide a support frame for a pellicle which can reduce deformation of the transparent substrate.

Means for Solving the Problem

A support frame for a pellicle of the present invention includes a frame body made of aluminum alloy. The frame body has: a top surface onto which a pellicle film is bonded; and an underside surface onto which a transparent substrate is bonded. A material of which the frame body is made has a Young's modulus larger than that of which the transparent substrate is made.

The support frame of the present invention supports the transparent substrate using the frame body having high rigidity. This makes it possible to reduce deformation of the transparent substrate. In particular, the support frame of the present invention can effectively reduce deformation of a large-sized transparent substrate used in manufacturing a liquid crystal panel.

In the support frame of the present invention, rigidity of the frame body is made larger by increasing the Young's modulus of the material of the frame body. This makes it possible to avoid increasing a size of the frame body, compared to that of a frame body of a conventional support frame.

The support frame of the present invention can ensure a sufficient rigidity of the frame body and prevent a height and a width of the frame body from increasing. This makes it possible to increase an inner circumferential dimension of the frame body and decrease the height of the frame body.

There is need for increasing an inner circumferential dimension of the support frame for a pellicle, to thereby enhance efficiency in producing a liquid crystal panel. The support frame of the present invention can make the inner circumferential dimension of the support frame larger, while preventing an outer circumferential dimension of the frame body from being made larger, because rigidity of the frame body is high. In the present invention, efficiency in producing a liquid crystal panel can be thus enhanced, because, even when the outer circumferential dimension of the support frame is limited in accordance with a structure of a support mechanism of a photolithography apparatus, the inner circumferential dimension of the support frame can be increased.

The support frame of the present invention supports the transparent substrate using the frame body having high rigidity. This makes it possible to: reduce deformation of the transparent substrate M; and make accuracy in dimensions of the transparent substrate M more stable. The pellicle using the support frame of the present invention is thus suitable for a transparent substrate on which a superfine circuit pattern is drawn.

The frame body having high rigidity of the support frame of the present invention is hardly deformable. This makes it possible to prevent tension of the pellicle film from decreasing, after the pellicle film is bonded to the frame body.

In the support frame for a pellicle described above, when the material of the frame body has the Young's modulus not less than 72 GPa, deformation of a large-sized transparent substrate can be reduced more effectively.

As a material of which the frame body is made, an aluminum alloy composed of Al (aluminum), Si (silicon), and unavoidable impurities (Al—Si alloy) may be used.

As the material of the frame body, an aluminum alloy composed of Al (aluminum), Mn (manganese), and unavoidable impurities (Al—Mn alloy) may also be used.

As the material of the frame body, an aluminum alloy composite composed of Al (aluminum), SiC (silicon carbide), and unavoidable impurities may also be used.

Advantageous Effects of the Invention

The support frame of the present invention can effectively reduce deformation of a large-sized transparent substrate using the frame body having high rigidity. This makes it possible to make accuracy in dimensions of the transparent substrate more stable. The support frame of the present invention can secure a sufficient rigidity of the frame body, even without making the frame body larger in size. This makes it possible to have a larger inner circumferential dimension of the support frame.

BRIEF DESCRIPTION OF THE DRAWINGS

FIG. 2 is a side sectional diagram illustrating the pellicle and the transparent substrate according to the embodiment of the present invention.

EMBODIMENT FOR CARRYING OUT THE INVENTION

Figure 1:
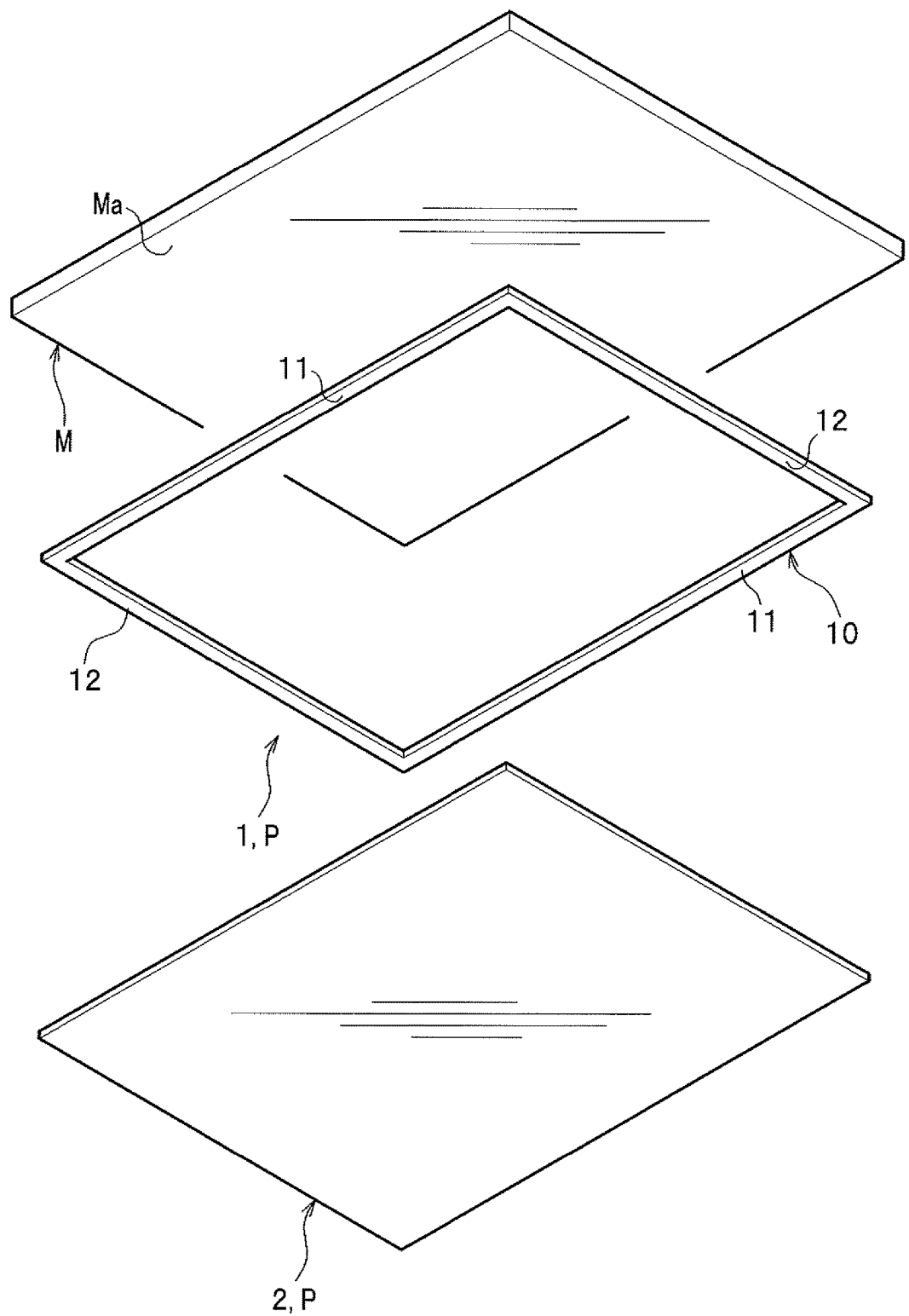
FIG. 1 is a perspective diagram illustrating a pellicle and a transparent substrate according to an embodiment of the present invention.

An embodiment of the present invention is described in detail with reference to related drawings where appropriate.

Each of the figures according to the embodiment illustrates some parts of a support frame schematically where appropriate, so as to explain a structure of the support frame in an easily understood manner.

In the description below, a front and a back, a right and a left, and a top side and an underside are set so as to explain the support frame in an easily understood manner, which is not intended to limit the structure and a state how the support frame is used.

A support frame 1 according to an embodiment is used for a pellicle P, as illustrated in FIG. 1. The pellicle P is a dust-proof cover for preventing dust or the like from adhering to an underside surface Ma of a transparent substrate M (a photomask) in a photolithography step for manufacturing a liquid crystal panel.

The transparent substrate M is a glass substrate on which a circuit pattern is drawn and has an outer circumferential part supported by a support mechanism of a photolithography apparatus.

The pellicle P includes: the support frame 1 that surrounds an entire circuit pattern (not shown) drawn on the transparent substrate M; and a pellicle film 2 that covers a surface of the support frame 1.

The pellicle P is suitable for use in manufacturing a large liquid crystal panel which has the transparent substrate M with a shorter side of not less than 300 mm and a longer side of not less than 400 mm in dimensions. The support frame 1 of the pellicle P as described above has, for example, a shorter side of not less than 250 mm and a longer side of not less than 350 mm in dimensions.

The support frame 1 includes a frame body 10 which is rectangular as viewed from above. The frame body 10 is manufactured from aluminum alloy material.

The frame body 10 includes: a pair of long frames 11, 11 on a front and a back sides; and a pair of short frames 12, 12 on a right and a left sides. The long frames 11, 11 and the short frames 12, 12 each have a rectangular-shaped cross section.

The long frames 11, 11 constitute respective long sides of the frame body 10. The short frames 12, 12 constitute respective short sides of the frame body 10.

A material of which the frame body 10 in this embodiment is made is an aluminum alloy (JIS 4000 series aluminum alloy) which is composed of Si—Al alloy containing a 5 to 13 mass percent of Si (silicon) and unavoidable impurities.

The material of the frame body 10 has the Young's modulus not less than 72 GPa. In the support frame 1 in this embodiment, the material of the frame body 10 is set to have the Young's modulus larger than that of the transparent substrate M. This makes rigidity of the frame body 10 larger than that of the transparent substrate M.

As illustrated in FIG. 2, an adhesive agent is applied to the underside surface 10b of the frame body 10. The underside surface 10b of the frame body 10 is thus bonded to the underside surface Ma of the transparent substrate M via an adhesive layer 5.

This conveniently prevents the transparent substrate M from easily undergoing deflection under its own weight, because the frame body 10 having high rigidity supports the transparent substrate M on an underside surface Ma side.

The pellicle film 2 is a transparent polymer membrane having a thickness of 10 μm or less and made of nitrocellulose, cellulose derivatives, fluorine polymers, or the like. As illustrated in FIG. 1, the pellicle film 2 is rectangular as viewed from above and has a shape same as an outer shape of the support frame 1.

As illustrated in FIG. 2, the pellicle film 2 is bonded to a top surface 10a of the frame body 10 via a bonding layer 4.

As illustrated in FIG. 1, the support frame 1 described above have the frame body 10 having high rigidity that can securely support the transparent substrate M. This makes it possible to effectively reduce deformation (deflection) of the large transparent substrate M. The photolithography apparatus can thus support the transparent substrate M suitably flat. This makes it possible to transfer a circuit pattern drawn on the transparent substrate M onto resist on a glass substrate with high accuracy.

A maximum amount of self-weight deflection of the transparent substrate M to which the support frame 1 in this embodiment is bonded can be reduced to about 20% of a maximum amount of self-weight deflection of the transparent substrate M to which a conventional support frame of which material has the Young's modulus not more than the material of the transparent substrate M is bonded.

In the support frame 1 in this embodiment, rigidity of the frame body 10 is made larger by increasing the Young's modulus of the material of the frame body 10. This makes it possible to avoid increasing a size of the frame body 10, compared to that of a frame body of the conventional support frame.

The support frame 1 in this embodiment can ensure a sufficient rigidity of the frame body 10 and prevent a height and a width of the frame body 10 from increasing.

The support frame 1 in this embodiment thus allows: an inner circumferential dimension of the frame body 10 to become large; an exposure area of a glass substrate to become large; and a height of the frame body 10 to become small. The support frame 1 in this embodiment can also enhance efficiency in producing a liquid crystal panel, because, even when an outer circumferential dimension of the support frame 1 is limited in accordance with a structure of a support mechanism of a photolithography apparatus, the inner circumferential dimension of the support frame 1 can be made larger.

The support frame 1 in this embodiment makes it possible to support the transparent substrate M, using the frame body 10 having high rigidity. This allows: deformation of the transparent substrate M to be reduced; and accuracy in dimensions of the transparent substrate M to be made more stable. The pellicle P using the support frame 1 in this embodiment is thus suitable for the transparent substrate M on which a superfine circuit pattern is drawn.

The frame body 10 having high rigidity of the support frame 1 in this embodiment is hardly deformable. This makes it possible to prevent tension of the pellicle film 2 from decreasing, after the pellicle film 2 is bonded to the frame body 10.

The embodiment of the present invention has been described above. The present invention is not, however, limited to the aforementioned embodiment, and various changes are possible within a scope not departing from the gist of the present invention.

The frame body 10 in this embodiment is made of aluminum alloy containing Si. The material of which the frame body 10 is made is not, however, limited to this.

The material of the frame body 10 in this embodiment includes, for example, an aluminum alloy which is composed of Al—Mn alloy containing a 5 to 15 mass percent of Mn (manganese) and unavoidable impurities.

Another material of the frame body 10 in this embodiment is, for example, an aluminum alloy composite which is composed of aluminum alloy containing a 10 to 30 mass percent of SiC (silicon carbide) and unavoidable impurities.

In this embodiment, the support frame 1 is attached to the underside surface Ma of the transparent substrate M. The support frame 1 may be, however, attached to a top surface of the transparent substrate M.

DESCRIPTION OF REFERENCE NUMERALS

1 support frame
2 pellicle film
10 frame body
10*a* top surface
10*b* underside surface
11 long frame
12 short frame
M transparent substrate
P pellicle

The invention claimed is:

1. A support frame for a pellicle for a photomask used in manufacturing a liquid crystal panel, comprising a frame body made of aluminum alloy and having a shorter side of not less than 250 mm and a longer side of not less than 350 mm in dimension,
   wherein the frame body has: a top surface onto which a pellicle film is bonded; and an underside surface onto which a transparent substrate is bonded, and
   wherein a material of which the frame body is made has a Young's modulus larger than that of which the transparent substrate is made.

2. The support frame for a pellicle according to claim 1, wherein the material of the frame body has the Young's modulus not less than 72 GPa.

3. The support frame for a pellicle according to claim 1, wherein the material of the frame body is an aluminum alloy composed of Al, Si, and unavoidable impurities.

4. The support frame for a pellicle according to claim 1, wherein the material of the frame body is an aluminum alloy composed of Al, Mn, and unavoidable impurities.

5. The support frame for a pellicle according to claim 1, wherein the material of the frame body is an aluminum alloy composed of Al, SiC, and unavoidable impurities.

6. The support frame for a pellicle according to claim 2, wherein the material of the frame body is an aluminum alloy composed of Al, Si, and unavoidable impurities.

7. The support frame for a pellicle according to or claim 2, wherein the material of the frame body is an aluminum alloy composed of Al, Mn, and unavoidable impurities.

8. The support frame for a pellicle according to claim 2, wherein the material of the frame body is an aluminum alloy composed of Al, SiC, and unavoidable impurities.

9. The support frame for a pellicle according to claim 3, wherein the material of the frame body is an aluminum alloy which is composed of Si—Al alloy containing a 5 to 13 mass percent of Si and unavoidable impurities.

10. The support frame for a pellicle according to claim 4, wherein the material of the frame body is an aluminum alloy which is composed of Si—Mn alloy containing a 5 to 15 mass percent of Mn and unavoidable impurities.

11. The support frame for a pellicle according to claim 5, wherein the material of the frame body is an aluminum alloy which is composed of aluminum alloy containing a 10 to 30 mass percent of SiC and unavoidable impurities.

12. The support frame for a pellicle according to claim 6, wherein the material of the frame body is an aluminum alloy which is composed of Si—Al alloy containing a 5 to 13 mass percent of Si and unavoidable impurities.

13. The support frame pellicle according to claim 7, wherein the material of the frame body is an aluminum alloy which is composed of Si—Mn alloy containing a 5 to 15 mass percent of Mn and unavoidable impurities.

14. The support frame for a pellicle according to claim 8, wherein the material of the frame body is an aluminum alloy which is composed of aluminum alloy containing a 10 to 30 mass percent of SiC and unavoidable impurities.

* * * * *